United States Patent
Blomgren et al.

(10) Patent No.: US 9,264,066 B2
(45) Date of Patent: Feb. 16, 2016

(54) TYPE CONVERSION USING FLOATING-POINT UNIT

(71) Applicant: Apple Inc., Cupertino, CA (US)

(72) Inventors: James S. Blomgren, Austin, TX (US); Terence M. Potter, Austin, TX (US)

(73) Assignee: Apple Inc., Cupertino, CA (US)

( * ) Notice: Subject to any disclaimer, the term of this patent is extended or adjusted under 35 U.S.C. 154(b) by 193 days.

(21) Appl. No.: 13/954,936

(22) Filed: Jul. 30, 2013

(65) Prior Publication Data

US 2015/0039661 A1    Feb. 5, 2015

(51) Int. Cl.
G06F 9/30    (2006.01)
H03M 7/24    (2006.01)

(52) U.S. Cl.
CPC ............ *H03M 7/24* (2013.01); *G06F 9/30025* (2013.01)

(58) Field of Classification Search
None
See application file for complete search history.

(56) References Cited

U.S. PATENT DOCUMENTS

| | | | |
|---|---|---|---|
| 6,148,316 A | 11/2000 | Herbert et al. | |
| 6,990,505 B2 | 1/2006 | Ahmed | |
| 7,216,138 B2 | 5/2007 | Abdallah et al. | |
| 2006/0149803 A1* | 7/2006 | Siu et al. | 708/501 |
| 2009/0113186 A1 | 4/2009 | Kato et al. | |
| 2013/0262539 A1* | 10/2013 | Wegener | 708/204 |

OTHER PUBLICATIONS

Microsoft, "Data Conversion Rules", https://msdn.microsoft.com/en-us/library/windows/desktop/dd607323, Jan. 2012.*
Zeuxcg.org, "Quantizing floats", http://zeuxcg.org/2010/12/14/quantizing-floats/, Dec. 2010.*
Mathworks, "Quantize and encode floating-point inputs to integer outputs—MATLAB uencode", http://www.mathworks.com/help/signal/ref/uencode.html, 2015.*

* cited by examiner

*Primary Examiner* — Andrew Caldwell
*Assistant Examiner* — Matthew Sandifer
(74) *Attorney, Agent, or Firm* — Meyertons, Hood, Kivlin, Kowert & Goetzel, P.C.

(57) ABSTRACT

Techniques are disclosed relating to type conversion using a floating-point unit. In one embodiment, to convert a floating-point value to a normalized integer format, a floating-point unit is configured to perform an operation to generate a result having a significant portion and an exponent portion, where the operation includes multiplying the floating-point value by a constant. In one embodiment, the apparatus is further configured to add a value to the exponent portion of the result, and set a rounding mode to round to nearest. The constant may be a greatest value less than one that can be represented using the particular number of unsigned bits. The value added to the initial exponent may be equal to the number of unsigned bits of the normalized integer format. The apparatus may perform this conversion in response to a pack instruction.

14 Claims, 7 Drawing Sheets

| Format | Normalize? | Round Mode | Constant and exponent adjustment |
|---|---|---|---|
| 8b S | norm | rtne | A * 0.11111110000000000000000 + 0, add 7 to exponent |
| 8b | norm | rtne | A * 0.11111111000000000000000 + 0, add 8 to exponent |
| 16b S | norm | rtne | A * 0.11111111111111100000000 + 0, add 15 to exponent |
| 16b | norm | rtne | A * 0.11111111111111110000000 + 0, add 16 to exponent |
| 8b S | integer | rtz | A * 1.00000000000000000000000 + 0, no adjustment to exponent |
| 8b | integer | rtz | A * 1.00000000000000000000000 + 0, no adjustment to exponent |
| 16b S | integer | rtz | A * 1.00000000000000000000000 + 0, no adjustment to exponent |
| 16b | integer | rtz | A * 1.00000000000000000000000 + 0, no adjustment to exponent |
| 32b S | integer | rtz | A * 1.00000000000000000000000 + 0, no adjustment to exponent |
| 32b | integer | rtz | A * 1.00000000000000000000000 + 0, no adjustment to exponent |
| 32b S | integer | rtne | A * 1.00000000000000000000000 + 0, no adjustment to exponent |
| 32b | integer | rtne | A * 1.00000000000000000000000 + 0, no adjustment to exponent |

FIG. 4

| Format | Artificial Exponent | Repeating Fraction (bit positions, e.g., as implemented by element 320 in Fig. 3) |
|---|---|---|
| 8b S norm | 000000 | .6 5 4 3 2 1 0 6 5 4 3 2 1 0 6 5 4 3 2 1 0 6 5 4 3 2 1 0 6 5 4 3 |
| 8b norm | 000000 | .7 6 5 4 3 2 1 0 7 6 5 4 3 2 1 0 7 6 5 4 3 2 1 0 7 6 5 4 3 2 1 0 |
| 16b S norm | 000000 | .E D C B A 9 8 7 6 5 4 3 2 1 0 E D C B A 9 8 7 6 5 4 3 2 1 0 E D |
| 16b norm | 000000 | .F E D C B A 9 8 7 6 5 4 3 2 1 0 F E D C B A 9 8 7 6 5 4 3 2 1 0 |
| 8b S | 000111 | 6 5 4 3 2 1 0. |
| 8b | 001000 | 7 6 5 4 3 2 1 0. |
| 16b S | 001111 | F E D C B A 9 8 7 6 5 4 3 2 1 0. |
| 16b | 010000 | F E D C B A 9 8 7 6 5 4 3 2 1 0. |
| 32b S | 011111 | 1F 1E 1D 1C 1B 1A 19 18 17 16 15 14 13 12 11 10 F E D C B A 9 8 7 6 5 4 3 2 1 0. |
| 32b | 100000 | 1F 1E 1D 1C 1B 1A 19 18 17 16 15 14 13 12 11 10 F E D C B A 9 8 7 6 5 4 3 2 1 0. |

Perform an operation to generate a result having a significand portion and an exponent portion, including multiplying a floating-point number by a number equal to a greatest value less than one that can be represented using a number of unsigned bits of a normalized integer output format
710

Change the exponent portion of the result by adding the particular number to the exponent portion
720

Round the result
730

FIG. 7

TYPE CONVERSION USING FLOATING-POINT UNIT

BACKGROUND

1. Technical Field

This disclosure relates generally to type conversion, and more specifically to type conversion using a floating-point unit.

2. Description of the Related Art

Graphics processing often involves type conversion. For example, computations are typically performed using floating-point numbers, but results may be stored using integer formats. Thus, conversion between floating-point numbers and integer formats may be common. As one specific example, the OPENGL® UNORM and SNORM normalized integer formats are used to store representations of floating-point numbers in the ranges 0 to 1.0 and −1.0 to 1.0 respectively. These formats may be converted to floating-point numbers and vice versa using the unpack and pack operations. This type conversion may be performed using dedicated units in graphics execution pipelines. However, dedicated units may increase chip area, e.g., because they may require an extra set of flops for providing source operands.

SUMMARY

Techniques are disclosed relating to type conversion using a floating-point unit. In one embodiment, to convert a floating-point value to a normalized integer format, a floating-point unit is configured to perform an operation to generate a result having a significand portion and an exponent portion, where the operation includes multiplying the floating-point value by a constant. In one embodiment, the apparatus is further configured to add a value to the exponent portion of the result, and set a rounding mode to round to nearest. The constant may be a greatest value less than one that can be represented using the particular number of unsigned bits. The value added to the initial exponent may be equal to the number of unsigned bits of the normalized integer format. The apparatus may perform this conversion in response to a pack instruction.

In another embodiment, to convert a number in an integer format to a floating-point number, an apparatus is configured to generate a significand using a repeating fraction technique and to provide an exponent. The apparatus may be configured to convert the number to a floating-point number by providing the significand and exponent to a floating-point unit. The repeating fraction technique may include starting with a most significant unsigned bit of the integer format and repeating the unsigned bits until a desired significand size is reached. The exponent may be zero for normalized integer input formats and the number of unsigned bits of an integer output format for non-normalized integer formats.

BRIEF DESCRIPTION OF THE DRAWINGS

FIGS. 4 and 5 illustrate exemplary parameters for performing pack and unpack operations using a floating-point unit.

FIG. 7 is a flow diagram illustrating a method for converting a floating-point number to an integer format.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Various units, circuits, or other components may be described or claimed as "configured to" perform a task or tasks. In such contexts, "configured to" is used to connote structure by indicating that the units/circuits/components include structure (e.g., circuitry) that performs the task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. §112(f) for that unit/circuit/component.

DETAILED DESCRIPTION

Figure 1A:
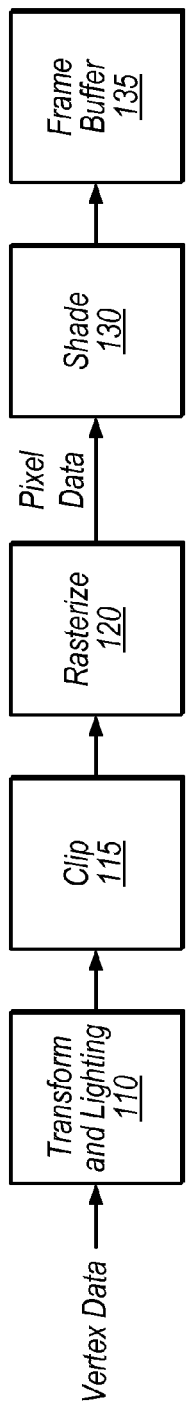
FIG. 1A is a block diagram illustrating a simplified graphics processing flow.
Figure 1B:
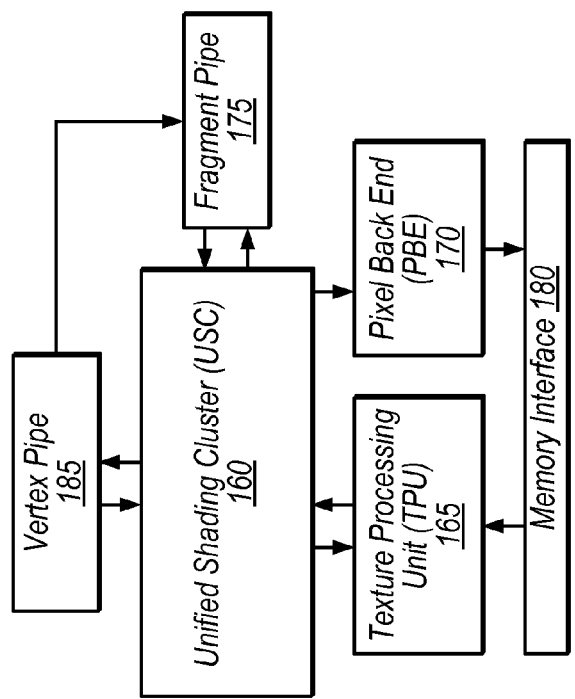
FIG. 1B is a block diagram illustrating one embodiment of a graphics unit.

This disclosure initially describes, with reference to FIGS. 1A-B, an overview of a graphics processing flow and an exemplary graphics unit. It then describes number types with reference to FIG. 2. One embodiment of a floating-point unit configured to implement pack and unpack operations and examples of such operations are described in further detail with reference to FIGS. 3-5 and 7, and an exemplary device is described with reference to FIG. 6. In some embodiments, a graphics unit as described herein may reduce processor area required to implement pack and unpack operations.

Referring to FIG. 1A, a flow diagram illustrating an exemplary processing flow 100 for processing graphics data is shown. In one embodiment, transform and lighting step 110 may involve processing lighting information for vertices received from an application based on defined light source locations, reflectance, etc., assembling the vertices into polygons (e.g., triangles), and/or transforming the polygons to the correct size and orientation based on position in a three-dimensional space. Clip step 115 may involve discarding polygons or vertices that fall outside of a viewable area. Rasterize step 120 may involve defining fragments or pixels within each polygon and assigning initial color values for each fragment, e.g., based on texture coordinates of the vertices of the polygon. Shade step 130 may involve altering pixel components based on lighting, shadows, bump mapping, translucency, etc. Shaded pixels may be assembled in a frame buffer 135. Modern GPUs typically include programmable shaders that allow customization of shading and other processing steps by application developers. Thus, in various embodiments, the exemplary steps of FIG. 1A may be performed in various orders, performed in parallel, or omitted, and additional processing steps may be implemented.

Referring now to FIG. 1B, a simplified block diagram illustrating one embodiment of a graphics unit 150 is shown. In the illustrated embodiment, graphics unit 150 includes unified shading cluster (USC) 160, vertex pipe 185, fragment pipe 175, texture processing unit (TPU) 165, pixel back end (PBE) 170, and memory interface 180. In one embodiment, graphics unit 150 may be configured to process both vertex and fragment data using USC 160, which may be configured to process graphics data in parallel using multiple execution pipelines or instances.

Vertex pipe 185, in the illustrated embodiment, may include various fixed-function hardware configured to process vertex data. Vertex pipe 185 may be configured to communicate with USC 160 in order to coordinate vertex processing. In the illustrated embodiment, vertex pipe 185 is configured to send processed data to fragment pipe 175 and/or USC 160 for further processing.

Fragment pipe 175, in the illustrated embodiment, may include various fixed-function hardware configured to process pixel data. Fragment pipe 175 may be configured to communicate with USC 160 in order to coordinate fragment processing. Fragment pipe 175 may be configured to perform rasterization on polygons from vertex pipe 185 and/or USC 160 to generate fragment data. Vertex pipe 185 and/or fragment pipe 175 may be coupled to memory interface 180 (coupling not shown) in order to access graphics data.

USC 160, in the illustrated embodiment, is configured to receive vertex data from vertex pipe 185 and fragment data from fragment pipe 175 and/or TPU 165. USC 160 may be configured to perform vertex processing tasks on vertex data which may include various transformations and/or adjustments of vertex data. USC 160, in the illustrated embodiment, is also configured to perform fragment processing tasks on pixel data such as texturing and shading, for example. USC 160 may include multiple execution instances for processing data in parallel. USC 160 may be referred to as "unified" in the illustrated embodiment in the sense that it is configured to process both vertex and fragment data. In other embodiments, programmable shaders may be configured to process only vertex data or only fragment data.

TPU 165, in the illustrated embodiment, is configured to schedule fragment processing tasks from USC 160. In one embodiment, TPU 165 may be configured to pre-fetch texture data and assign initial colors to fragments for further processing by USC 160 (e.g., via memory interface 180). TPU 165 may be configured to provide fragment components in normalized integer formats or floating-point formats, for example. In one embodiment, TPU 165 may be configured to provide fragments in groups of four (a "fragment quad") in a 2×2 format to be processed by a group of four execution instances in USC 160.

PBE 170, in the illustrated embodiment, is configured to store processed tiles of an image and may perform final operations to a rendered image before it is transferred to a frame buffer (e.g., in a system memory via memory interface 180). Memory interface 180 may facilitate communications with one or more of various memory hierarchies in various embodiments.

In various embodiments, a programmable shader such as USC 160 may be coupled in any of various appropriate configurations to other programmable and/or fixed-function elements in a graphics unit. The exemplary embodiment of FIG. 1B shows one possible configuration of a graphics unit 150 for illustrative purposes.

In one embodiment, USC 160 includes multiple execution instances, which each may include one or more floating-point units and one or more other execution units. In some embodiments, USC 160 may be configured to perform conversion operations between floating-point and normalized and/or non-normalized integer formats, such as pack and unpack operations. As used herein, the term "normalized integer format" refers to a format in which an integer is used to represent a value in a given range that is different than a range of representable values in the integer format. For example, an integer format capable of representing values between 0 and 255 may be used to represent values between 0 and 1.0. In another situation, the same integer format may be used to represent values between −100 and 100. In either situation, the format is being used as a normalized integer format. In contrast, if the same integer format is being used to represent values between 0 and 255 (e.g., floating-point values), it is not being used as a normalized integer format. Including a dedicated unit for pack and unpack operands in each execution instance may require additional processor area and/or cause an increase in power consumption. For example, each execution data path may require another set of source operand flops to provide inputs to such a dedicated unit. Therefore, in some embodiments, USC 160 is configured to perform pack and unpack operations using existing floating-point units in shader execution instances. In some embodiments, including elements in an existing floating-point unit that are configured to perform pack and unpack operations may slightly increase power consumption for each given pack or unpack operation, compared to implementing these operations using a dedicated unit. However, pack and unpack are typically not encountered very often, so overall power consumption may be decreased by performing pack and unpack operations using an existing floating-point unit.

Figure 2:
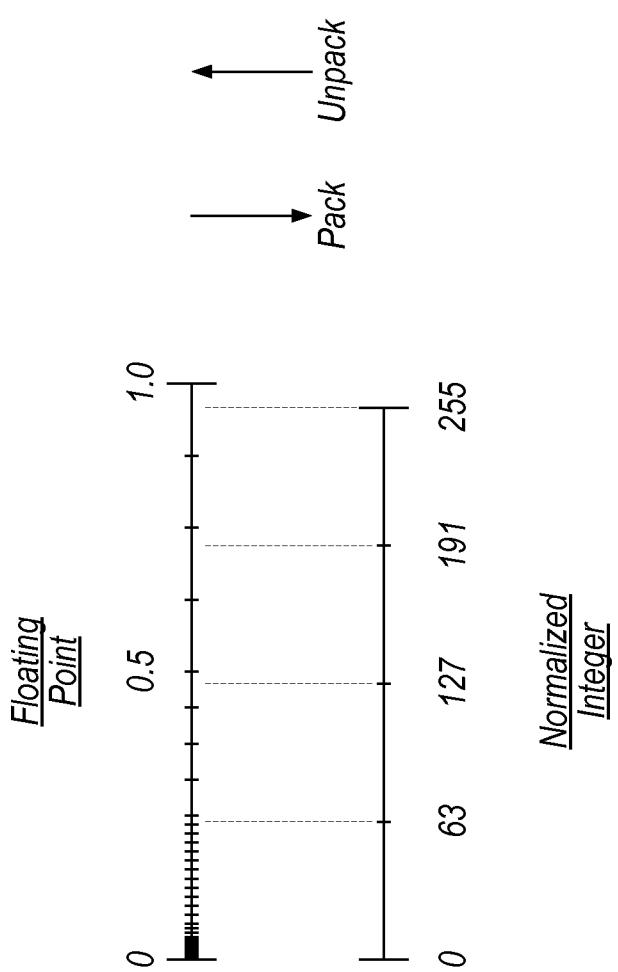
FIG. 2 is a diagram illustrating exemplary number formats.

FIG. 2 illustrates exemplary number formats. In the illustrated embodiment, the normalized integer format can have values between 0 and 255 (e.g., using 8 bits) and may be used to store "packed" floating-point values between 0 and 1.0. As shown in the illustrated embodiment, the periodicity between floating-point values representable in a given floating-point format is different depending on how near a value is to zero or one. For example, there are more representable values closer to zero than to one. This is a typical characteristic caused by the nature of floating-point. The tick marks in the illustrated embodiment of the floating-point line indicate representable values. The tick marks in the illustrated embodiment of the normalized integer line represent four of 256 representable values for illustrative purposes. The illustrated number lines are not necessarily drawn to scale with respect to each other or with respect to any particular number formats, but are intended to illustrate potential difficulties in pack and unpack operations.

To convert a floating-point value to the normalized integer format, one might think to multiply the floating-point value by 256 to achieve a normalized integer value. However, as shown, 8-bit unsigned integers range from 0 to 255, so we would not be able to represent 1.0 using such an approach (1.0 times 256=256 which cannot be represented using an 8-bit signed integer). Thus, accurate conversion between formats may involve slightly spreading/contracting to obtain results with less skew. The illustrated dashed lines show that representable values in the normalized integer format do not directly correspond to representable values in a floating-point format, and vice versa.

In various embodiments, similar issues may exist for signed floating-point representations (e.g., of values between −1.0 and 1.0 and/or other ranges) and for various sizes/ranges of number formats. Exemplary integer formats include SNORM8 (8-bit signed), UNORM8 (8-bit unsigned), SNORM16 (16-bit signed), etc. As shown, an unpack operation involves converting from a normalized integer format to a floating-point format, while a pack operation involves converting from a floating-point format to a normalized integer format.

Exemplary Floating-Point Unit

Figure 3:
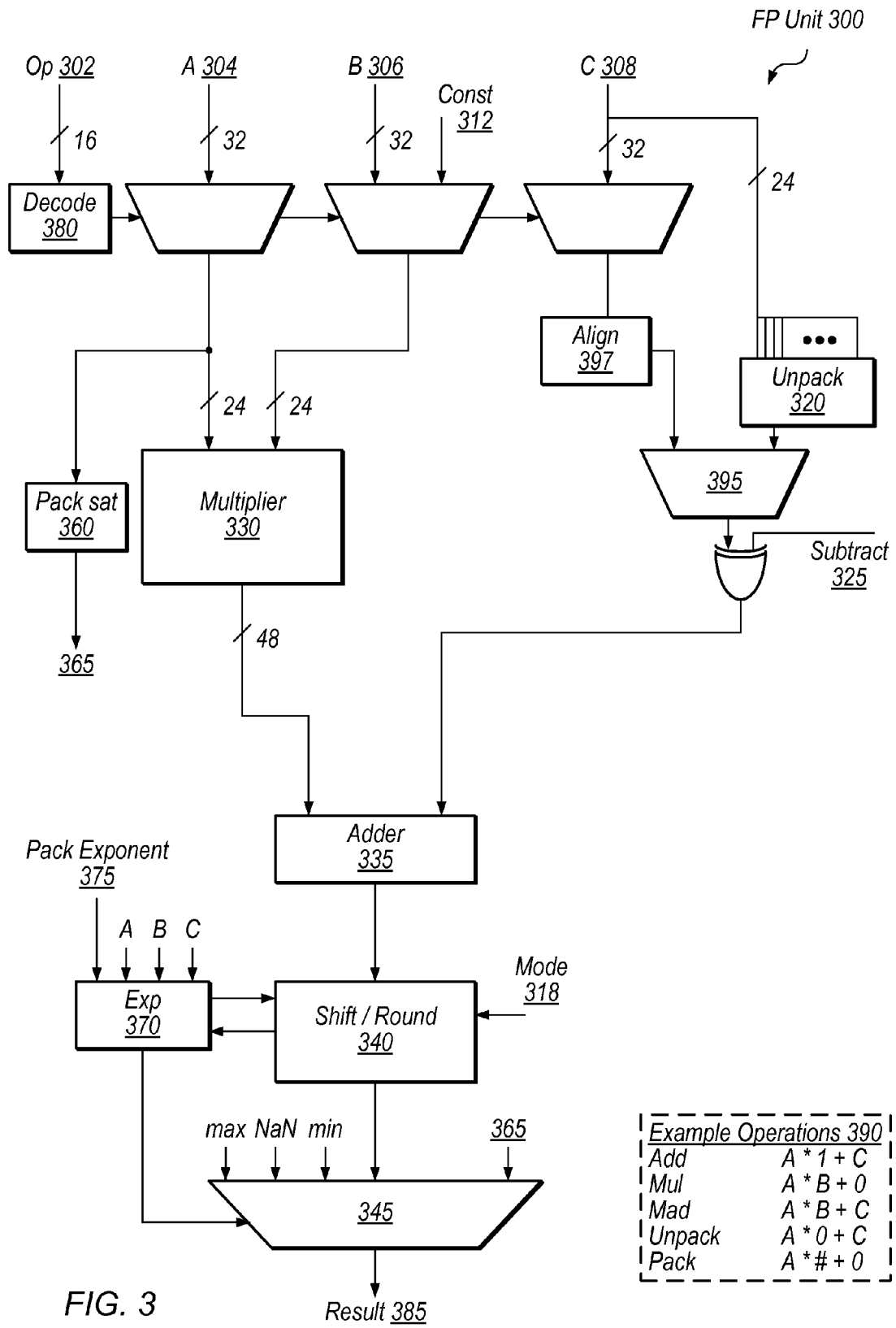
FIG. 3 is a block diagram illustrating one embodiment of a floating-point unit.

Referring now to FIG. 3, a block diagram illustrating one embodiment of a floating-point unit (FP unit) 300 is shown.

Example operations 390 in the lower right corner of FIG. 3 show operations that FP unit 300 may be configured to perform, e.g., based on a received opcode 302. In one embodiment, based on opcode 302, FP unit 300 is configured to perform add, multiply, multiply-add, pack, and unpack operations, for example, on input operands A 304, B 306 and/or C 308. In one embodiment, for the pack operation, FP unit 300 is configured to multiply operand A by a constant 312, adjust an exponent of the result, and round to nearest even. In one embodiment, for the unpack operation, FP unit 300 is configured to multiply operand A by zero and use a repeating fraction technique to adjust operand C.

In the illustrated embodiment, USC 160 provides each of operands A-C to a respective MUX that is controlled by decoder 380 based on a received opcode 302. For example, in one embodiment, decoder 380 may select either operand B 306 or constant 312 in response to determining whether an instruction is a pack instruction. Other MUX inputs are not shown, but may arrive from other processing elements in USC 160, for example.

In the illustrated embodiment, operands A, B, and C are each 32-bit floating-point numbers. In other embodiments, operands having any of various appropriate numbers of bits may be implemented. In one embodiment, operand C may have a width that is twice as large as the widths of operands A and B. In the illustrated embodiment, each 32-bit floating-point number includes a sign bit, eight exponent bits, and 23 significand bits, which may conform to an IEEE® standard, for example.

In the illustrated embodiment, multiplier 330 is configured to multiply the significands of operands A and B provide the 48-bit result to adder 335. In one embodiment, exp unit 370 is configured to add the exponent fields of operands A and B to facilitate the multiplication of operands A and B. In the illustrated embodiment, MUX 395 is configured to select between the significand of operand C and the output of unpack block 320 (described in further detail below). Subtract signal 325 may indicate inversion of the bits of C if it is to be subtracted rather than added (e.g., when it has a value of '1'), and the output of this bitwise XOR is provided to adder 335 in the illustrated embodiment. Subtraction may require adding a 1 to an inverted operand, and this addition is performed by adder 335, in one embodiment. In one embodiment, align block 397 may be configured to normalize the significand of operand C by shifting it, e.g., based on the exponents fields of operands A and B. In one embodiment, align block 397 is configured to maintain a sticky bit to facilitate rounding by shift/round unit 340. In the illustrated embodiment, the output of multiplier 330 and the XOR gate are provided to adder 335, and the result of adder 335 which is configured to add its two inputs and provide the result to shift/round unit 340. The right input of adder 335, in one embodiment, includes enough bits to represent a full set of alignments of C relative to the output of multiplier 330 for a fused multiply-add architecture.

Shift/round unit 340, in the illustrated embodiment, may be configured to normalize various significands based on the exponents of operands A, B, C, and/or pack exponent 375. For example, in one embodiment, exp unit 370 is configured to add the exponents of operands A and B and may be configured to add a pack exponent value to this initial exponent. Exp unit 370 may send an indication to shift/round unit 340 to shift the input from adder 335 based on the exponent result. Further, shift/round unit 340 may be configured to shift the input from adder 335 based on a rounding result. Significand shifting may occur at various points in FP unit 300, but shift/round unit 340 and align unit 397 are shown in their respective locations in the illustrated embodiment for illustrative purposes. In the illustrated embodiment, shift/round unit 340 is configured to implement various rounding techniques based on mode 318. In one embodiment, decode unit 380 is configured to set mode 318 based on the nature of the operation to be performed by FP unit 300.

For example, "round to nearest" (RTN) refers to a rounding mode in which values are rounded to a nearest representable value. A nearest representable value may be based on a number of bits used to represent the value. As example of round to nearest in the decimal context, rounding the number 3.7 to an integer representation would give the value 4. Ties may be resolved in various ways. One technique for resolving ties is "round to nearest even" (RTNE). Using this technique, the number 3.5 would round to 4 instead of three when rounding to an integer because 4 is even and 3 is odd. As used herein, the term "round to nearest" includes the RTNE technique as well as any other methods for resolving ties for the round to nearest method.

One typical rounding implementation keeps track of three bits that fall out of the significand when shifting a floating-point number. These bits are often referred to as guard (g), round (r), and sticky (s) bits. For example, for the following significand where the "|" represents the cut-off point (bits to the right of have been shifted out)

1.XXXXXXXXXXXXXXXXXXXXXXX|grs the guard and round bits are extra bits of precision used for rounding. The sticky bit indicates whether there are any 1's in less significant bits than the round bit: while shifting the significand, if a value of 1 ever enters the sticky bit position, it remains there despite further shifts. The decision to round for RTN can be made using the following table:

| grs | action |
|-----|--------|
| 0xx | round down = do nothing (x means any bit value, 0 or 1) |
| 100 | tie (for RTNE, round up if the significand's bit just before G is 1, otherwise round down = do nothing) |
| 101 | round up |
| 110 | round up |
| 111 | round up |

The guard, round, and/or sticky bits may also be used for other rounding modes. Shift/round unit 340 may include circuitry configured to track guard, round, and sticky bits and appropriately set significand bits of the result of adder 335 based on these bits and mode 318. In other embodiments, any appropriate implementation of the rounding modes disclosed herein may be implemented.

As used herein, "round to zero" refers to a rounding method in which numbers are rounded to the next representable value in the direction of zero. For example, 3.7 rounded to zero to an integer is 3. Round to zero may be performed using truncation, for example. Other common rounding modes include round up and round down (i.e., round to infinity and round to negative infinity).

MUX 345, in the illustrated embodiment, is configured to select a result for FP unit 300 based on the exponent from exponent block 370. Possible results includes a max value (e.g., infinity), a minimum value (e.g., zero or negative infinity), not a number (NaN), and pack saturation value 350.

In the illustrated embodiment, FP unit 300 is configured to take 32-bit floating-point operands A, B and C and generate a 64-bit result. In other embodiments, floating-point units configured to operate on operands of any of various appropriate sizes may be implemented.

Pack Operation Using Exemplary Floating-Point Unit

In the illustrated embodiment, FP unit 300 is configured to select constant 312 instead of operand B as an input to multiplier 330 in response to detecting a pack operation or instruction (e.g., by decode unit 390). In this embodiment, the floating-point value provided as operand A is a floating-point value to be packed into a normalized integer format. In one embodiment, constant 312, for normalized integer output formats, is determined based on the number of unsigned bits of the desired output format. As used herein, the term "unsigned bits" refers to bits that are not sign bits. For example, an 8-bit signed number "suuuuuuu" has one sign bit (s) and 7 unsigned bits (u's). An 8-bit unsigned number has eight unsigned bits. For an output format with N unsigned bits, constant 312 may be determined according to the formula $$\text{const} = \frac{(2^N - 1)}{2^N}.$$

This may be the greatest value less than one that can be represented using the particular number of unsigned bits. For example, for an 8-bit signed integer output format (seven unsigned bits), the constant would be 127/128=0.9921875 (decimal) which is equal to 0.1111111 (binary, uses seven 1's). Constant 312 may be stored in a lookup table in a storage element. Further examples of constant values for output formats with different numbers of unsigned bits are discussed below with reference to FIG. 4.

Pack saturation block 360, in the illustrated embodiment, is configured to determine if the input floating-point number of operand A is too large or too small to be represented using an integer format and is thus outside of a desired range (e.g., for a normalized signed format, the floating-point number is smaller than −1.0 or greater than 1.0). In one embodiment, if such saturation occurs, pack saturation unit 360 may be configured to provide a saturation value 365 to MUX 350 (intervening connection not shown) that is the greatest or smallest value that can be represented using the desired output format. In this embodiment, exp unit 370 may be configured to indicate that MUX 345 should select saturation value 365 when saturation has occurred. In the illustrated embodiment, for pack operations, operand C is set to zero, e.g., using the input MUX controlled by decode unit 380 or using unpack block 320. Mode 318, in one embodiment, is set to round to nearest even for normalized pack operations and round to zero for most integer pack operations (see FIG. 4 below).

Pack exponent 375, in one embodiment, is a value added to an initial exponent determined by FP unit 300 for pack operations. The initial exponent may be determined based on multiplication of operand A and constant 312, e.g., by adding the exponents of operand A and constant 312. In one embodiment, the value of pack exponent 375 is the number of unsigned bits in the desired output format. Thus, for an 8-bit signed number, the value of pack exponent 375 would be seven, which exp unit 370 is configured add to the initial exponent determined by FP unit 300 in one embodiment. This may result in an effective multiplication by two to the value added to the exponent. In some embodiments, for some non-normalized pack operations, pack exponent 375 may be zero.

Finally, FP unit 300, in the illustrated embodiment, is configured to set mode 318 to indicate round to nearest even for pack operations when the output is a normalized integer format. In one embodiment, shift/round unit 340 is configured to perform RTNE rounding based on mode 318. Shift/round unit 340 may be configured to round after shifting the significand received from adder 335 based on the exponent from exp unit 370 (which may include the value added to the initial exponent). In various embodiments, this shift and round may achieve a desired "spread" in conversion to a packed integer format. The packed integer result, in one embodiment, may be read from least significant significand bits of the result 385 from MUX 345 of FP unit 300.

Unpack Operation Using Exemplary Floating-Point Unit

In the illustrated embodiment, in response to detecting an unpack operation or instruction (e.g., by decode unit 390), FP unit 300 is configured to set constant 312 to zero and select constant 312 instead of operand B (or otherwise ensure that the output of multiplier 330 is zero).

Unpack block 320, in the illustrated embodiment, is configured to generate a significand by repeating bits of an integer value to be unpacked, which may be provided as operand C. In one embodiment, unpack block 320 is configured to begin with a most significant unsigned bit of the input and repeat the unsigned bits of the input until a desired significand size is reached. Examples of this repeating fraction technique are discussed in further detail below with respect to FIG. 5. In some embodiments, FP unit 300 is configured to set mode 318 to indicate round to nearest even for unpack operations.

In some embodiments, unpack block 320 (or some other element of FP unit 300), is also configured to create an artificial exponent for operand C. In some embodiments the artificial exponent is zero for normalized integer output formats but has a value indicating a number of places to shift the decimal point for non-normalized integer output formats, as shown in FIG. 5.

In some embodiments, pack saturation block 365, unpack block 320, constant 312, and pack exponent 375 may be additional elements added to a conventional floating-point unit. In various embodiments, this may allow use of a floating-point unit to perform pack and unpack operations in a graphics unit, which may reduce power consumption and area in embodiments where graphics execution pipelines include floating-point units.

Referring now to FIG. 4, a number of examples of parameters for pack operations of various sizes are shown. The values in the format column indicate the number of bits used in the desired integer output format and whether or not the output format is signed (S) or unsigned. The normalize column indicates whether the pack operation involves normalization (e.g., for floating-point values between −1.0 and 1.0 or 0 and 1.0 as discussed with reference to FIG. 2) or an integer pack operation. The rounding mode indicates the rounding mode. "rtne" refers to round to nearest even, while "rtz" refers to round to zero. The "constant and exponent adjustment" column indicates the value of the constant to multiply by the value to be converted (A) and any adjustment to the exponent.

For example, for an 8-bit signed value, A is multiplied by 0.1111111 (binary), which is 0.9921875 in decimal, or 127/128. Adding 7 to the exponent results in an effective multiplication by 128. Therefore, the pack operation for an 8-bit signed number may involve multiplying the value to be converted (A) by 127/128, effectively multiplying the result by 128, and using round to nearest even after the effective multiply. This may achieve the desired "spread" discussed above with reference to FIG. 2.

Speaking generally, the constant may be formed as a greatest value less than one that can be represented in binary using a number of 1's equal to the number of unsigned bits of the desired output format. This may produce a value equal to $$\frac{(2^N - 1)}{2^N}$$

where N is the number of unsigned bits in a desired output format. For non-normalized pack operations, FP unit 300 may set the constant to 1 and may not adjust the exponent, as shown in FIG. 4.

The adjustment to the exponent is determined, in some embodiments, by adding a value equal to the number of unsigned bits of the desired output format to an initial exponent determined by FP unit 300.

Referring now to FIG. 5, a number of examples of parameters for unpack operations are shown. The values in the format column indicate a number of bits used in the input format and whether or not the input/result should be signed (S) or unsigned. The "norm" notation indicates that an unpack operation involves normalization. The artificial exponent field indicates an exponent to be generated along with the repeating fraction indicated in the repeating fraction field. The repeating fraction field indicates bit positions used for each bit in a significand generated using a repeating fraction technique. For example, for 8-bit unsigned normalized, the repeating fraction is formed starting with bit 7 of the input followed by bit 6, then bit 5, then bit 4, etc.

Unpack block 320 may be configured to generate the repeating fractions of FIG. 5. Unpack block 320 or some other element of FP unit 300 may be configured to generate the artificial exponent, e.g., to be provided to adder 335 along with the generated significand. In one embodiment, a round-to-nearest even rounding mode may be used. In other embodiments where less accuracy is acceptable, other rounding modes such as round to zero may be implemented.

The repeating fraction technique may be implemented in some embodiments in order to avoid division. For example (using decimal numbers), consider a value between 0 and 99 (i.e. 50) where 0 and 99 are the largest and smallest values representable in a given format. To expand this value to a format with one more representable value (e.g., that represents values between 0 and 100) division by 0.99 would be performed. However, division is typically more difficult than multiplication. Instead, one can multiply by the reciprocal of 0.99 (1/0.99)=1.01010101 in this case. When expanding by only one representable number, the position of the 1's in such reciprocals happens to fit the size of the operand (i.e., two input digits), thus repeating a fraction may achieve the same results as multiplying by 1.010101 . . . . This explanation of the repeating fraction technique applies to binary representations as well as decimal representations.

The examples of FIGS. 4 and 5 include input and output formats of various sizes of integers. Various sizes of input and output floating-point numbers may also be implemented include 16-bit, 64-bit, etc., and the floating-point numbers may have fields of different sizes which may or may not conform to a floating-point standard such as an IEEE® floating-point standard. The examples of FIGS. 4 and 5 are exemplary and non-limiting: in other embodiments, any of various formats of various sizes may be implemented.

Figure 6:
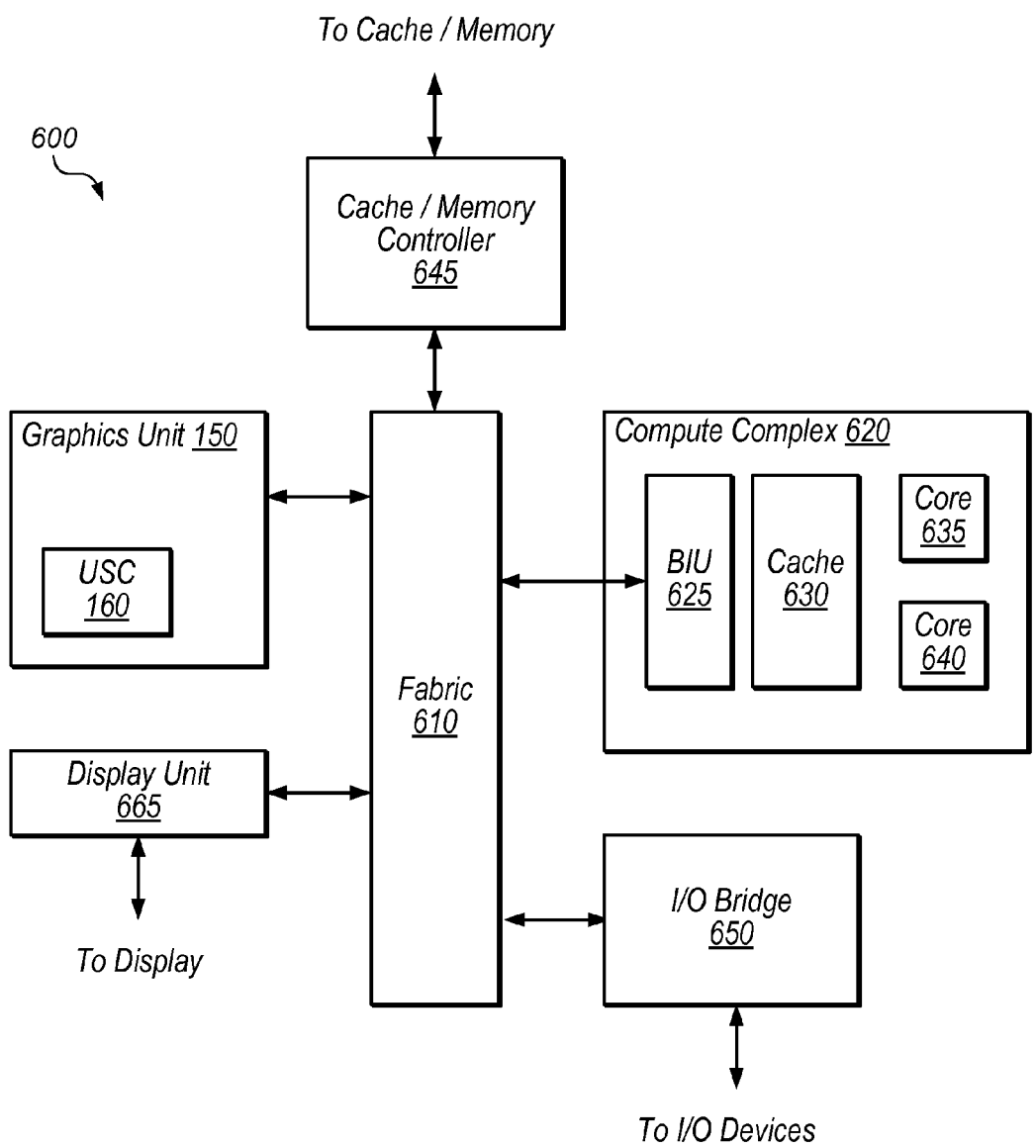
FIG. 6 is a block diagram illustrating a device that includes a graphics unit.

Referring now to FIG. 6, a block diagram illustrating an exemplary embodiment of a device 600 is shown. In some embodiments, elements of device 600 may be included within a system on a chip. In some embodiments, device 600 may be included in a mobile device, which may be battery-powered. Therefore, power consumption by device 600 may be an important design consideration. In the illustrated embodiment, device 600 includes fabric 610, compute complex 620, input/output (I/O) bridge 650, cache/memory controller 645, graphics unit 150, and display unit 665.

Fabric 610 may include various interconnects, buses, MUX's, controllers, etc., and may be configured to facilitate communication between various elements of device 600. In some embodiments, portions of fabric 610 may be configured to implement various different communication protocols. In other embodiments, fabric 610 may implement a single communication protocol and elements coupled to fabric 610 may convert from the single communication protocol to other communication protocols internally.

In the illustrated embodiment, compute complex 620 includes bus interface unit (BIU) 625, cache 630, and cores 635 and 640. In various embodiments, compute complex 620 may include various numbers of cores and/or caches. For example, compute complex 620 may include 1, 2, or 4 processor cores, or any other suitable number. In one embodiment, cache 630 is a set associative L2 cache. In some embodiments, cores 635 and/or 640 may include internal instruction and/or data caches. In some embodiments, a coherency unit (not shown) in fabric 610, cache 630, or elsewhere in device 600 may be configured to maintain coherency between various caches of device 600. BIU 625 may be configured to manage communication between compute complex 620 and other elements of device 600. Processor cores such as cores 635 and 640 may be configured to execute instructions of a particular instruction set architecture (ISA) which may include operating system instructions and user application instructions.

Cache/memory controller 645 may be configured to manage transfer of data between fabric 610 and one or more caches and/or memories. For example, cache/memory controller 645 may be coupled to an L3 cache, which may in turn be coupled to a system memory. In other embodiments, cache/memory controller 645 may be directly coupled to a memory. In some embodiments, cache/memory controller 645 may include one or more internal caches.

As used herein, the term "coupled to" may indicate one or more connections between elements, and a coupling may include intervening elements. For example, in FIG. 6, graphics unit 150 may be described as "coupled to" a memory through fabric 610 and cache/memory controller 645. In contrast, in the illustrated embodiment of FIG. 6, graphics unit 150 is "directly coupled" to fabric 610 because there are no intervening elements.

Graphics unit 150 may be configured as described above with reference to FIGS. 1B and 3. Graphics unit 150 may include one or more processors and/or one or more graphics processing units (GPU's). Graphics unit 150 may receive graphics-oriented instructions, such OPENGL® or DIRECT3D® instructions, for example. Graphics unit 150 may execute specialized GPU instructions or perform other operations based on the received graphics-oriented instructions. Graphics unit 150 may generally be configured to process large blocks of data in parallel and may build images in a frame buffer for output to a display. Graphics unit 150 may include transform, lighting, triangle, and/or rendering engines in one or more graphics processing pipelines. Graphics unit 150 may output pixel information for display images. In the illustrated embodiment, graphics unit 150 includes USC 160.

Display unit 665 may be configured to read data from a frame buffer and provide a stream of pixel values for display. Display unit 665 may be configured as a display pipeline in some embodiments. Additionally, display unit 665 may be configured to blend multiple frames to produce an output frame. Further, display unit 665 may include one or more interfaces (e.g., MIPI® or embedded display port (eDP)) for coupling to a user display (e.g., a touchscreen or an external display).

I/O bridge 650 may include various elements configured to implement: universal serial bus (USB) communications, security, audio, and/or low-power always-on functionality, for example. I/O bridge 650 may also include interfaces such as pulse-width modulation (PWM), general-purpose input/output (GPIO), serial peripheral interface (SPI), and/or inter-integrated circuit (I2C), for example. Various types of peripherals and devices may be coupled to device 600 via I/O bridge 650.

Referring now to FIG. 7, a flow diagram illustrating one exemplary embodiment of a method 700 for converting a floating-point number to an integer format is shown. The method shown in FIG. 7 may be used in conjunction with any of the computer systems, devices, elements, or components disclosed herein, among other devices. In various embodiments, some of the method elements shown may be performed concurrently, in a different order than shown, or may be omitted. Additional method elements may also be performed as desired. Method 710 may include multiple steps for converting a floating-point number to a normalized integer output format having a particular number of unsigned bits. Flow begins at block 710.

At block 710, an operation is performed to generate a result having a significand portion and an exponent portion. In this embodiment, the operation includes multiplying a floating-point number by a number equal to a greatest value less than one that can be represented using a number of unsigned bits of the normalized integer output format. FP unit 300 may perform this multiplication using multiplier 330 and/or exp unit 370, for example. USC 160 may input the number as constant 312 to FP unit 300. Flow proceeds to block 720.

At block 720, the exponent portion of the result is changed by adding the particular number to the exponent portion. Exp unit 370 may be configured to perform this addition to an initial exponent result. Flow proceeds to block 730.

At block 730, rounding is performed. This rounding may use the round to nearest even mode. Shift/round unit 340 may perform this rounding, e.g., using guard, round, and sticky bits tracked during shifting of a result from adder 335. Thus, the rounding may be performed on a shifted result from adder 335 (e.g., shifted based on the changing of the exponent portion before rounding). The multiplying, adding, and rounding may provide a "spread" in a pack operation which may prevent skew in packed results when using a floating-point unit. Flow ends at block 730.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A method, comprising:
   converting, by floating-point circuitry, a floating-point number to a normalized integer output format having a particular number of unsigned bits, wherein the floating-point circuitry includes a multiplier and multiplexer circuitry configured to select between multiple input circuits configured to provide numbers to an input of the multiplier, wherein the converting includes:
   performing an operation, by the multiplier, to generate a result having a significand portion and an exponent portion, wherein the operation includes multiplying the floating-point number by a constant number provided by an input circuit selected by the multiplexer circuitry, wherein the constant number is equal to a greatest value less than one that can be represented using the particular number of unsigned bits;
   changing, by exponent adjustment circuitry, the exponent portion of the result by adding the particular number to the exponent portion; and
   rounding the result, by the floating-point circuitry, after the adding.

2. The method of claim 1, wherein the rounding includes rounding using a round to nearest even mode.

3. The method of claim 1,
   wherein the integer output format is a 16-bit signed integer output format;
   wherein the particular number of unsigned bits is 15; and
   wherein the number equal to a greatest value less than one that can be represented using the particular number of unsigned bits is represented in binary by 0.111111111111111.

4. The method of claim 1, further comprising:
   saturating an integer result to a greatest or smallest representable number of the integer output format in response to determining that the floating-point number is outside of a desired range.

5. The method of claim 1, wherein the floating-point number is a number between negative 1.0 and 1.0 and the integer output format is a signed integer format.

6. The method of claim 1, further comprising reading a normalized integer result from the significand portion of the result.

7. An apparatus, comprising:
   floating-point circuitry comprising a multiplier and multiplexer circuitry configured to select between multiple input circuits configured to provide numbers to an input of the multiplier, wherein the floating-point circuitry is configured to convert a floating-point value to a normalized integer format by:
   performing an operation by the multiplier to generate a result having a significand portion and an exponent portion, wherein the operation includes multiplying the floating-point value by a constant provided by an input circuit selected by the multiplexer circuitry, wherein the multiplying includes adding an exponent of the floating-point value to an exponent of the constant to generate the exponent portion of the result;
   adding, using exponent adjustment circuitry, a value to the exponent portion of the result, wherein the value is equal to a number of unsigned bits of the normalized integer format; and
   rounding the result according to a rounding mode of the floating-point circuitry;

wherein the apparatus is configured to:
set the rounding mode of the floating-point circuitry to round to nearest; and
determine a value for the constant based on the number of unsigned bits of the normalized integer format.

8. The apparatus of claim 7, wherein the apparatus is configured to determine a value for the constant that is equal to $$\frac{(2^N - 1)}{2^N}$$

where N is the number of unsigned bits of the normalized integer format.

9. The apparatus of claim 7, wherein the constant is a greatest value less than one that can be represented using the number of unsigned bits.

10. The apparatus of claim 7, further comprising:
a repeating fraction unit configured to repeat bits of an input integer starting with a most significant unsigned bit to generate a significand;
wherein, to convert an input operand represented using a normalized integer format to a second floating-point value, the apparatus is configured to provide an artificial exponent to the floating-point circuitry.

11. The apparatus of claim 10, wherein the artificial exponent is zero.

12. The apparatus of claim 10, wherein the apparatus is configured to set an input operand provided to the multiplier to zero.

13. The apparatus of claim 7, wherein the apparatus is configured to detect a floating-point value that is out of a desired input range and, in response to detecting the floating-point value that is out of the desired input range, provide a saturated integer value as a result of the conversion.

14. The apparatus of claim 7,
wherein the floating-point value is a floating-point number between 0 and 1.0 and wherein the integer format is a 8-bit unsigned integer format;
wherein the number of unsigned bits is 8; and
wherein the constant is represented in binary as 0.11111111.

* * * * *